(12) United States Patent
Chiyajo et al.

(10) Patent No.: US 10,197,635 B2
(45) Date of Patent: Feb. 5, 2019

(54) FILTER CIRCUIT

(71) Applicant: YAZAKI CORPORATION, Minato-ku, Tokyo (JP)

(72) Inventors: Yuki Chiyajo, Shizuoka (JP); Hidehiko Shimizu, Shizuoka (JP); Yasutaka Wakasugi, Shizuoka (JP)

(73) Assignee: YAZAKI CORPORATION, Minato-ku, Tokyo (JP)

( * ) Notice: Subject to any disclaimer, the term of this patent is extended or adjusted under 35 U.S.C. 154(b) by 273 days.

(21) Appl. No.: 14/968,051

(22) Filed: Dec. 14, 2015

(65) Prior Publication Data

US 2016/0097818 A1 Apr. 7, 2016

Related U.S. Application Data

(63) Continuation of application No. PCT/JP2014/065746, filed on Jun. 13, 2014.

(30) Foreign Application Priority Data

Jun. 19, 2013 (JP) .................................. 2013-128880

(51) Int. Cl.
*H01M 10/48* (2006.01)
*G01R 31/36* (2006.01)
(Continued)

(52) U.S. Cl.
CPC ............ *G01R 31/3658* (2013.01); *B60L 3/12* (2013.01); *B60L 11/1861* (2013.01); *B60L 11/1864* (2013.01); *G01R 19/16542* (2013.01); *G01R 31/362* (2013.01); *G01R 31/3662* (2013.01); *H01M 10/425* (2013.01); *B60L 2240/547* (2013.01); *G01R 19/0053* (2013.01);

*H01M 10/482* (2013.01); *H01M 2010/4271* (2013.01); *H01M 2220/20* (2013.01);
(Continued)

(58) Field of Classification Search
None
See application file for complete search history.

(56) References Cited

U.S. PATENT DOCUMENTS

2012/0194135 A1 8/2012 Mizoguchi

FOREIGN PATENT DOCUMENTS

JP 2003-282158 A 10/2003
JP 2007-240299 A 9/2007
(Continued)

OTHER PUBLICATIONS

International Search Report for PCT/JP2014/065746 dated Sep. 16, 2014 [PCT/ISA/210].
(Continued)

*Primary Examiner* — Wyatt P McConnell
(74) *Attorney, Agent, or Firm* — Sughrue Mion, PLLC

(57) ABSTRACT

By configuring low-pass filters each with a resistor and a capacitor, noise is removed. Based on a reference value of DC voltage that appears at output terminals of a battery pack circuit, a lowering portion of capacitance that arises in the respective capacitors is estimated in advance, and a compensation value is included in the resistance value of the respective resistors such that the cutoff frequencies of the low-pass filters are within an intended range. Even when a high voltage is handled, the variance in cutoff frequencies can be prevented from arising and the noise in an unnecessary frequency domain can be adequately reduced.

8 Claims, 3 Drawing Sheets

(51) Int. Cl.
    *G01R 19/165*     (2006.01)
    *H01M 10/42*     (2006.01)
    *B60L 3/12*     (2006.01)
    *B60L 11/18*     (2006.01)
    *G01R 19/00*     (2006.01)

(52) U.S. Cl.
    CPC ........ *Y02T 10/7005* (2013.01); *Y02T 10/7044* (2013.01); *Y02T 10/7061* (2013.01)

(56) References Cited

FOREIGN PATENT DOCUMENTS

| JP | 2007-281915 A | 10/2007 |
|---|---|---|
| JP | 2011-069639 A | 4/2011 |
| JP | 2012-159406 A | 8/2012 |
| JP | 2013-094032 A | 5/2013 |

OTHER PUBLICATIONS

Written Opinion for PCT/JP2014/065746 dated Sep. 16, 2014 [PCT/ISA/237].

| CELL | NOMINAL RESISTANCE VALUE [kΩ] | CERAMIC CAPACITOR CAPACITANCE [uF] | VOLTAGE APPLIED TO CERAMIC CAPACITOR [V] | CERAMIC CAPACITOR CAPACITANCE IN CONSIDERATION OF DC BIAS CHARACTERISTICS [uF] | ACTUAL CUTOFF FREQUENCY [Hz] |
|---|---|---|---|---|---|
| 10 | 107 | 0.1 | 50 | 0.047 | 31.45 |
| 9 | 95.3 | 0.1 | 45 | 0.052 | 31.85 |
| 8 | 86.6 | 0.1 | 40 | 0.058 | 31.62 |
| 7 | 78.7 | 0.1 | 35 | 0.064 | 31.45 |
| 6 | 71.5 | 0.1 | 30 | 0.071 | 31.42 |
| 5 | 64.9 | 0.1 | 25 | 0.078 | 31.62 |
| 4 | 60.4 | 0.1 | 20 | 0.084 | 31.33 |
| 3 | 56 | 0.1 | 15 | 0.090 | 31.55 |
| 2 | 53.6 | 0.1 | 10 | 0.095 | 31.27 |
| 1 | 51 | 0.1 | 5 | 0.098 | 31.78 |
| $n$ | $Rf(n)$ | $Cf(n)$ | $Vx(n)$ | $Cx(n)$ | $Fc(n)$ |

FIG.4

| CELL | NOMINAL RESISTANCE VALUE [kΩ] | CERAMIC CAPACITOR CAPACITANCE [uF] | VOLTAGE APPLIED TO CERAMIC CAPACITOR [V] | CERAMIC CAPACITOR CAPACITANCE IN CONSIDERATION OF DC BIAS CHARACTERISTICS [uF] | ACTUAL CUTOFF FREQUENCY [Hz] |
|---|---|---|---|---|---|
| 10 | 51 | 0.1 | 50 | 0.047 | 65.98 |
| 9 | 51 | 0.1 | 45 | 0.052 | 59.52 |
| 8 | 51 | 0.1 | 40 | 0.058 | 53.70 |
| 7 | 51 | 0.1 | 35 | 0.064 | 48.54 |
| 6 | 51 | 0.1 | 30 | 0.071 | 44.05 |
| 5 | 51 | 0.1 | 25 | 0.078 | 40.24 |
| 4 | 51 | 0.1 | 20 | 0.084 | 37.10 |
| 3 | 51 | 0.1 | 15 | 0.090 | 34.64 |
| 2 | 51 | 0.1 | 10 | 0.095 | 32.86 |
| 1 | 51 | 0.1 | 5 | 0.098 | 31.78 |

FILTER CIRCUIT

CROSS-REFERENCE TO RELATED APPLICATION

This application is a continuation application of International Application PCT/JP2014/065746, filed on Jun. 13, 2014, and designating the U.S., the entire contents of which are incorporated herein by reference.

BACKGROUND OF THE INVENTION

1. Field of the Invention

The present invention relates to a filter circuit that is usable in an electric vehicle and a hybrid vehicle, for example.

2. Description of the Related Art

In an electric vehicle and a hybrid vehicle, as a power source that is usable for driving the vehicle, a secondary battery such as a lithium ion battery is used, for example. Furthermore, because the voltage is low with only a single battery, a battery pack circuit that is configured with a number of battery cells, for example, of eight or more being connected in series is used.

When such a battery pack circuit is employed, whether each of the battery cells is operating properly along with operations such as charging and discharging has to be monitored at all times. In general, the voltage between the terminals of each battery cell is measured, and by the measured voltage, the state of each battery cell is comprehended.

The actual voltage of each battery cell, however, is affected by complex fluctuations in current along with the charging and discharging, the intrusion of noise from outside, and others. That is, when measuring the DC voltage of each battery cell is attempted, there is a possibility of the occurrence of a serious measurement error, by the influence of noise of AC or high frequencies.

Consequently, in a battery-voltage measurement circuit disclosed in Japanese Patent Application Laid-open No. 2003-282158, an RC filter unit is connected between each output terminal of a battery pack circuit and an input terminal of a voltage measurement circuit, for example. That is, the voltage is measured after removing the noise components of AC and high-frequencies by using a low-pass filter configured with a resistor (R) and a capacitor (C).

In the RC filter unit in Japanese Patent Application Laid-open No. 2003-282158, however, because a capacitor is connected between the terminals of each of the battery cells, there is a possibility of not being able to remove the noise adequately. That is, the capability of removing the noise that arises between the terminal of each battery cell and the ground is low.

For example, when a capacitor of a filter is connected between the terminal of each battery cell and the ground, the capability of removing noise can be improved. In that case, however, the voltage applied between the terminals of the capacitor becomes high, and thus it is necessary to increase the withstand voltage of each capacitor. In this case, it is further conceivable that, due to a DC bias voltage of the capacitor, the capability of the filter may be deteriorated and an adverse effect may appear in the measurement of voltage.

For example, it is conceivable to employ, as a component of the filter, a ceramic capacitor that is relatively small, high in withstand voltage, and inexpensive. The ceramic capacitor, however, has a tendency of the capacitance to fluctuate depending on the applied DC bias voltage. When the capacitance fluctuates, the cutoff frequency of the filter is varied, and thereby the noise in low frequencies may not be removed adequately. Furthermore, when the cutoff frequency of the filter is conversely too low, the effect of the filter appears in also fast fluctuations in voltage of the battery cell itself other than the noise, and thus it is conceivable that the capability of monitoring the voltage may be deteriorated and that the capacitor may increase in size more than necessary.

SUMMARY OF THE INVENTION

The present invention has been made in view of the above-described situation. And an object of the present invention is to provide a filter circuit that is capable of adequately reducing the noise in an intended frequency domain even when a high DC voltage is applied to the input.

In order to solve the above mentioned problem and achieve the object, a filter circuit according to one aspect of the present invention is connected between a battery pack circuit configured with battery cells of two or more connected in series and a certain voltage detection circuit, in order to detect voltages of output terminals at connection points of the respective battery cells by the voltage detection circuit. The filter circuit includes a plurality of sets of filter units each configured with a resistor connected between any one of the output terminals of the battery pack circuit and any one of a plurality of input terminals of the voltage detection circuit, and a capacitor connected between the any one of the input terminals of the voltage detection circuit and a ground terminal. Here, a resistance value of the resistor is determined so as to include a compensation resistance value necessary to compensate for an estimated lowering amount of capacitance that arises in the capacitor with respect to a reference value of DC voltage at the appropriate output terminal.

Further, in the filter circuit according to another aspect of the present invention, it is preferable that the compensation resistance value is defined as a value necessary to make a cutoff frequency of filter, which is determined by a resistance value of the resistor and capacitance of the capacitor, into a predetermined certain value.

Further, in the filter circuit according to still another aspect of the present invention, it is preferable that the compensation resistance value takes a greater numerical value as the reference value of DC voltage at the appropriate output terminal is greater.

Further, in the filter circuit according to still another aspect of the present invention, it is preferable that a ceramic capacitor is used as the capacitor.

According to the filter circuit of the present invention, because the capacitor is connected between any one of the input terminals and the ground terminal, it is possible to adequately reduce the noise in an intended frequency domain. Furthermore, there is a possibility that the DC bias voltage (reference DC voltage) applied to the capacitor becomes high and, when the capacitor is, for example, a ceramic capacitor, there is a possibility that the capacitance lowers with respect to a prescribed value. However, the resistance value of the resistor is determined so as to include a compensation resistance value that is necessary to compensate for an estimated lowering amount of capacitance that arises in the capacitor, and thereby the influence of the DC bias voltage can be suppressed, and thus an adequate capability of reducing the noise in the intended frequency domain can be ensured.

According to the filter circuit of the present invention, in all sets of the filter units, the cutoff frequency of the filter can be brought close to a certain value even when the DC bias voltages applied to the capacitors differ significantly.

According to the filter circuit of the present invention, the filter unit is configured using a ceramic filter, and thereby a necessary and sufficient withstand voltage can be ensured easily, and a relatively small and inexpensive filter can be configured.

As in the foregoing, the invention has been explained in a concise manner. Moreover, reading through an illustrative embodiment for implementing the invention (hereinafter referred to as "embodiment") described in the following with reference to the accompanying drawings will further clarify the detail of the invention.

BRIEF DESCRIPTION OF THE DRAWINGS

FIG. 4 is a schematic diagram illustrating the list of the parameters when the influence of the DC bias voltage is not considered.

DETAILED DESCRIPTION OF THE PREFERRED EMBODIMENTS

The following describes a specific exemplary embodiment concerning a filter circuit according to the present invention with reference to the accompanying drawings.

Configuration of Circuit

Figure 1:
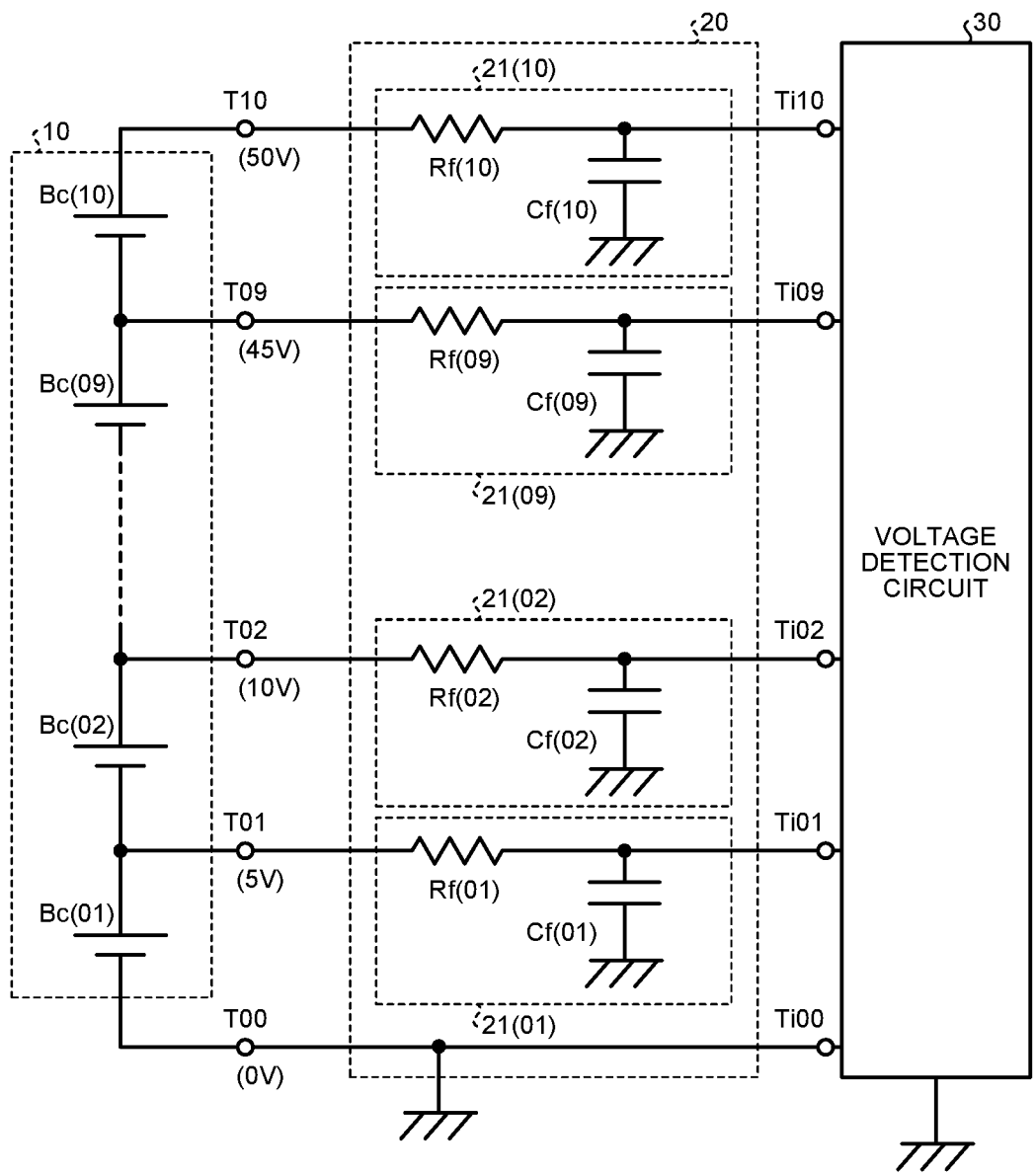
FIG. 1 is an electrical diagram illustrating an example of the configuration of an apparatus including a filter circuit.

FIG. 1 illustrates an example of the configuration of an apparatus including a filter circuit 20 according to the embodiment.

The apparatus illustrated in FIG. 1 can be assumed to be used in a state of being installed as a power source in an electric vehicle and a hybrid vehicle, for example. That is, a battery pack circuit 10 illustrated in FIG. 1 is used as a supply source of the electrical power necessary to generate a driving force of the vehicle.

Consequently, in the configuration example in FIG. 1, the battery pack circuit 10 is configured with 10 pieces of battery cells Bc(01), Bc(02), . . . , Bc(09), and Bc(10) connected in series so as to be able to supply an adequately high voltage. Each of the battery cells Bc(01) to Bc(10) is configured with a secondary battery that is rechargeable such as a lithium ion battery, for example.

Although the depiction is omitted in FIG. 1, in a state of the actual use, a charge circuit that supplies charging power to the battery pack circuit 10 and various loads on the vehicle that consume the electrical power of the battery pack circuit 10 are connected to the battery pack circuit 10.

In the example illustrated in FIG. 1, each battery cell Bc can output a voltage of 5 V as a rated voltage. Because the battery pack circuit 10 in FIG. 1 has 10 pieces of the battery cells Bc(01) to Bc(10) being connected in series, the battery pack circuit 10 can output a voltage of 50 V as a whole.

When such a battery pack circuit 10 is used, to accurately comprehend the charge state and discharge state or to monitor the presence of malfunctions of the battery cells Bc, for example, it is necessary to detect the voltages of the output terminals T01 to T10 of the battery pack circuit 10.

To detect the voltages of the output terminals T01 to T10, the apparatus illustrated in FIG. 1 is provided with a voltage detection circuit 30. That is, the voltage detection circuit 30 can, by monitoring the voltages applied to input terminals Ti01 to Ti10, detect the voltages of the battery cells Bc that constitute the battery pack circuit 10.

The power supply voltages appearing at the output terminals T01 to T10 of the battery pack circuit 10 are DC voltages basically. However, because there are cases of being affected by the current that fluctuates by charging and the current that flows to various loads and being influenced by the noise entering from the outside, the voltages appearing actually at the output terminals T01 to T10 include voltage components of AC and high-frequencies.

Consequently, to remove the unnecessary voltage components of AC and high-frequency noise when the voltage detection circuit 30 measures the DC voltages of the input terminals Ti01 to Ti10, the filter circuit 20 is connected.

The filter circuit 20 is configured with 10 sets of low-pass filters 21(01), 21(02), . . . , 21(09), and 21(10) independent of one another. Each of the low-pass filters 21 is connected between the output terminals of the battery pack circuit 10 and the input terminals of the voltage detection circuit 30.

For example, the first low-pass filter 21(01) is configured with a resistor Rf(01) and a capacitor Cf(01). The resistor Rf(01) is connected to the output terminal T01 at one end and is connected to the input terminal Ti01 at the other end. The capacitor Cf(01) is connected to the resistor Rf(01) and the input terminal Ti01 at one end, and is connected to a ground electrode at the other end.

The other low-pass filters 21(02) to 21(10) each have the same configuration. As for the resistance values of the resistors Rf(01) to Rf(10), values different from one another are assigned to the respective low-pass filters 21(01) to 21(10) as described later.

As the same as a commonly used low-pass filter (LPF), the low-pass filters 21(01) to 21(10) each can remove AC components of high frequencies and make only AC components of low frequencies and a DC component pass through. The cutoff frequency (rejection frequency) fc of the filter is determined by the resistance value of the resistor Rf and the capacitance of the capacitor Cf. That is, it is expressed by the following Expression.

$$fc = 1/(2\pi \cdot R \cdot C) \quad (1)$$

R: Resistance value of the resistor Rf
C: Capacitance of the capacitor Cf

As for the capacitors Cf(01) to Cf(10) constituting the respective low-pass filters 21(01) to 21(10), a ceramic capacitor having an adequate withstand voltage is employed. The nominal capacitance of each of the used capacitors Cf(01) to Cf(10) is 0.1 μf, the tolerance of capacitance is ±10%, and the withstand voltage is 100 V.

Explanation of Fluctuations in Capacitance

In the apparatus illustrated in FIG. 1, relatively high DC voltages are applied to the capacitors Cf(01) to Cf(10) constituting the respective low-pass filters 21(01) to 21(10). For example, between the terminals of the capacitor Cf(01), a DC voltage of 5V is applied from the output terminal T01 of the battery pack circuit 10 in a normal state, and between the terminals of the capacitor Cf(10), a DC voltage of 50V is applied from the output terminal T10. In the case of ceramic capacitors, there is a possibility that the capacitance fluctuates depending on the applied DC voltage.

Figures 2, 3:
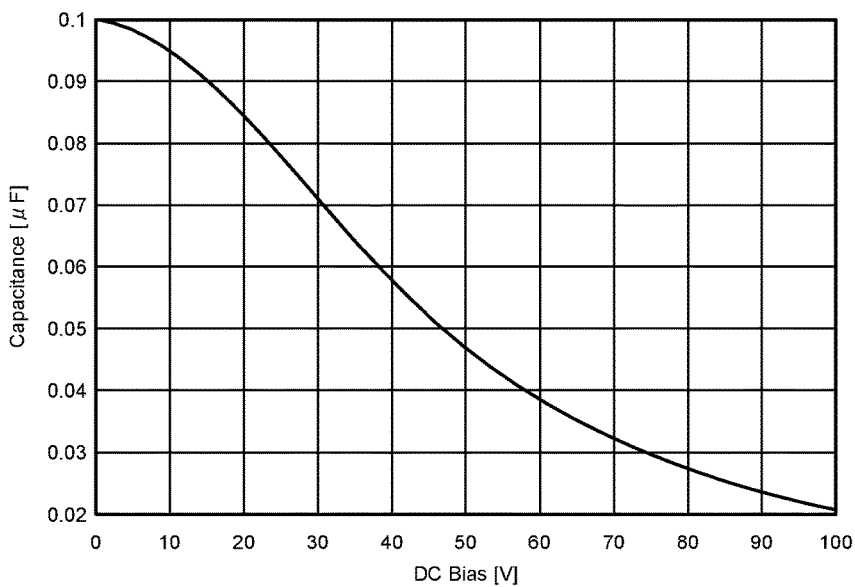
FIG. 2 is a schematic diagram illustrating a list of specific examples of parameters of the filter circuit illustrated in FIG. 1.
FIG. 3 is a graphic chart representing the measurement result concerning the correspondence between a DC bias voltage of a ceramic capacitor and the capacitance.

Consequently, to comprehend the actual correspondence between the DC bias voltage and the capacitance about the capacitor Cf employed for each of the low-pass filters 21(01) to 21(10), the measurement has been conducted by using a ceramic capacitor of the same type as the Cf. The measurement result is illustrated in FIG. 3. In FIG. 3, the abscissa axis represents the DC bias voltage (V) that is applied to the capacitor of the measurement subject, and the ordinate axis represents the value of capacitance (μF).

As can be found from the measurement result illustrated in FIG. 3, the actual capacitance of the ceramic capacitor significantly fluctuates depending on the applied DC voltage. For example, when the applied DC voltage comes to about 50 V, the actual capacitance drastically falls to about one half as compared with when the voltage is 0 V.

In the use environment of the filter circuit 20 illustrated in FIG. 1, because different voltages are applied to the capacitors Cf(01) to Cf(10), the actual capacitance of the capacitors Cf(01) to Cf(10) in a use state is expected to fluctuate as in the characteristics illustrated in FIG. 3.

However, when the actual capacitance of the capacitor Cf deviates from the prescribed value, the cutoff frequency fc of the filter is to fluctuate in accordance with the foregoing Expression (1). For example, if the capacitance comes to one half of the prescribed value, the cutoff frequency fc becomes twice as high. As a result, the low-pass filter 21(10) comes to a state of being unable to remove a low-frequency noise adequately, and thus the voltage detection circuit 30 is unable to detect accurate voltages, for example.

Countermeasure to Fluctuations in Capacitance

In the filter circuit 20 illustrated in FIG. 1, a countermeasure is taken such that the noise in an intended frequency band can be adequately removed. That is, compensation values that have been determined in advance are added to the resistance values of the resistors Rf(01) to Rf(10) such that the cutoff frequencies fc of the respective low-pass filters 21(01) to 21(10) do not fluctuate with respect to the fluctuations in capacitance as illustrated in FIG. 3. Specifically, it is as follows.

That is, in the environment of the apparatus illustrated in FIG. 1, the reference values (5, 10, 15, . . . , 45, 50 V) of the DC voltages applied to the capacitors Cf(01) to Cf(10) are predetermined, and unless otherwise a special condition such as a malfunction occurs, the applied DC voltages are never to deviate significantly from the reference values. Consequently, the portion of changes in capacitance by the influence of the DC bias voltage for each of the capacitors Cf(01) to Cf(10) can be estimated in advance.

By modifying the foregoing Expression (1), the following Expressions can be obtained.

$$R = 1/(2\pi \cdot C \cdot fc) \quad (2)$$

$$Rx = 1/(2\pi \cdot Cx \cdot fc) \quad (3)$$

Cx: Estimated capacitance of the capacitor Cf in consideration of the influence of the DC bias voltage V
Rx: Resistance value of the resistor Rf including the compensation value necessary to make the fc into a prescribed value Thus, an intended value (e.g., 31 to 32 Hz) of the cutoff frequency fc is first determined, and then the estimated capacitance Cx of each of the capacitors Cf(01) to Cf(10) and the cutoff frequency fc are substituted into the foregoing Expression (3). Consequently, the resistance value Rx of the resistor Rf after compensation is calculated. As for the estimated capacitance Cx, it can be obtained from the reference value Vx (5, 10, 15, . . . , 45, 50 V) of the DC voltage at the output terminal (any one of T01 to T10) to which the appropriate capacitor Cf is connected, and from the measurement result illustrated in FIG. 3.

However, there are restrictions on the resistance values of the resistor Rf that are actually available. That is, only the resistors of resistance values that actually exist in the series (e.g., E96) of resistors defined by the standard can be obtained. Thus, the resistance value that is the closest to the resistance value Rx after compensation calculated from the foregoing Expression (3) is selected from the series of resistors, and it is employed as the resistance value of the actual resistor Rf.

Consequently, the resistance value of the resistor Rf selected is an approximate value of the calculated value, and as a result, the actual cutoff frequency fc is to deviate somewhat from the predetermined frequency. Thus, the resistance value of the selected resistor Rf is substituted into the foregoing Expression (1), and the actual cutoff frequency fc is calculated. When the actual cutoff frequency fc is deviated from the intended range, the selection of resistance value of the resistor Rf is performed again, and another approximate value is selected.

FIG. 2 illustrates a list of specific examples of parameters of the filter circuit 20 illustrated in FIG. 1. FIG. 4 illustrates the list of the parameters when the influence of the DC bias voltage is not considered.

That is, an optimum resistance value of the resistor Rf(n) selected as the result of the above-described processing for each battery cell position (n: any of 1 to 10) and the parameters concerning the resistance value are illustrated in FIG. 2. As illustrated in FIG. 2, although the capacitance (rated value) of the capacitor Cf at each battery cell position (n) is all "0.1 μf," the actual capacitance Cx(n) in use becomes lower than "0.1 μF" because it is affected by the applied DC bias voltage.

For example, as for the capacitor Cf(10) connected to the battery cell Bc(10) of the 10th position, because the reference value Vx(10) of the applied DC voltage is 50 V, the actual capacitance Cx(10) lowers from 0.1 μf to 0.047 μf. This capacitance Cx(10) can be estimated from the measurement result illustrated in FIG. 3.

With respect to the actual capacitance Cx(n) at each position, a value that is approximate to the resistance value Rx after compensation calculated from the foregoing Expression (3) is selected as the resistance value of the resistor Rf(n) such that the cutoff frequency fc can be maintained within the intended frequency range.

Consequently, as for the resistor Rf(10) at the 10th position, selected is 107 kΩ that is available from E96 series as a resistance value, for example.

In this case, the resistance value of the resistor Rf(10) is 107 kΩ and the actual capacitance Cx(10) of the capacitor Cf(10) is 0.047 μf, and thus the cutoff frequency fc(10) calculated from the foregoing Expression (1) comes to 31.45 Hz.

Meanwhile, when the compensation value is not added to the resistance value of the resistor Rf, as illustrated in FIG. 4, the actual cutoff frequency fc varies for each position of the cell, and at the 10th cell position in particular, the cutoff frequency fc is 65.98 Hz and is significantly deviated from the intended range (31 to 32).

That is, as apparent from the comparison of the content in FIG. 2 and the content in FIG. 4, by correcting in advance the resistance value of the resistor Rf so as to compensate for the portion (estimated value) of lowering in the actual capacitance Cx of each capacitor Cf, the intended filter characteristics can be obtained. That is, even when a ceramic capacitor is used as the capacitor Cf in the use environment as in the apparatus illustrated in FIG. 1, the variance in the actual cutoff frequency fc can be prevented from arising, and the cutoff frequency fc can be maintained within the intended range. Consequently, the unnecessary noise components of AC and high frequencies included in the voltage that appears at each of the output terminals T01 to T10 of the battery pack circuit 10 can be adequately removed by the filter circuit 20.

Feasibility of Modifications

In the filter circuit 20 illustrated in FIG. 1, each of the resistor Rf is composed of a single component. However, a component comparable to the resistor Rf may be configured by connecting a plurality of resistors in series. In that case, it is conceivable to connect in series a first resistor corresponding to the resistance value obtained from the rated value of capacitance of the capacitor Cf and from the cutoff frequency fc, and a second resistor corresponding to a resistance value necessary to compensate for the lowering portion of the capacitance by the DC bias voltage, for example.

In the foregoing embodiment, the actual capacitance Cx (estimated value) is specified by the actual measurement result (the content in FIG. 3). However, even when the measurement result of the capacitance for an appropriate DC voltage is not present, the capacitance Cx can also be specified as an approximate value based on a function representing the characteristic curve as in FIG. 3 that is estimated from the measurement result, or based on the measurement result of an approximate voltage.

The following items (1) to (4) list in a concise and summarized manner the features of the filter circuit in the above-described embodiment according to the invention.

(1) A filter circuit (20) connected between a battery pack circuit (10) configured with battery cells of two or more connected in series and a certain voltage detection circuit (30), in order to detect voltages of output terminals (T01 to T10) at connection points of the respective battery cells by the voltage detection circuit (30), the filter circuit (20) including a plurality of sets of low-pass filters (21) each configured with a resistor (Rf) connected between any one of the output terminals (T01 to T10) of the battery pack circuit (10) and any one of a plurality of input terminals (Ti01 to Ti10) of the voltage detection circuit (30), and a capacitor (Cf) connected between the any one of the input terminals (Ti01 to Ti10) of the voltage detection circuit (30) and a ground terminal, in which a resistance value of the resistor (Rf) is determined so as to include a compensation resistance value necessary to compensate for an estimated lowering amount of capacitance that arises in the capacitor (Cf) with respect to a reference value (Vx(n)) of DC voltage at the appropriate output terminal (T01 to T10).

(2) The filter circuit (20) described in the item (1), in which the compensation resistance value is defined as a value necessary to make a cutoff frequency (fc) of filter, which is determined by a resistance value of the resistor (Rf) and capacitance of the capacitor (Cf), into a predetermined certain value.

(3) The filter circuit (20) described in the item (2), in which the compensation resistance value takes a greater numerical value as the reference value (Vx(n)) of DC voltage at the appropriate output terminal (T01 to T10) is greater.

(4) The filter circuit (20) described in any one of the items (1) to (3), in which a ceramic capacitor is used as the capacitor (Cf).

According to the filter circuit of the present invention, the noise in an intended frequency domain can be reduced adequately even when a high DC voltage is applied to the input. Consequently, it can be put to use for monitoring the voltage of a battery pack circuit that handles a relatively high voltage such as a power supply circuit of an electric vehicle and a hybrid vehicle, for example.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A filter circuit connected between a battery pack circuit configured with battery cells of two or more connected in series and a certain voltage detection circuit, in order to detect voltages of output terminals at connection points of the respective battery cells by the voltage detection circuit, the filter circuit comprising:

a plurality of sets of filter units each configured with one of a plurality of resistors connected between any one of the output terminals of the battery pack circuit and any one of a plurality of input terminals of the voltage detection circuit, and one of a plurality of capacitors connected between the any one of the input terminals of the voltage detection circuit and a ground terminal, wherein a resistance value of at least one of the resistors of one of the filter units is determined so as to include a compensation resistance value necessary to compensate for an estimated lowering amount of capacitance that arises in the one of the plurality of capacitors of the one of the filter units with respect to a reference value of DC voltage at one of the output terminals to which the one of the filter units is connected.

2. The filter circuit according to claim 1, wherein the compensation resistance value is defined as a value necessary to make a cutoff frequency of filter, which is determined by a resistance value of the at least one of the resistors of the one of the filter units and capacitance of the one of the plurality of capacitors of the one of the filter units, into a predetermined certain value.

3. The filter circuit according to claim 2, wherein the compensation resistance value takes a greater numerical value as the reference value of DC voltage at the one of the output terminals is greater.

4. The filter circuit according to claim 1, wherein a ceramic capacitor is used as the capacitor.

5. The filter circuit according to claim 2, wherein a ceramic capacitor is used as the capacitor.

6. The filter circuit according to claim 3, wherein a ceramic capacitor is used as the capacitor.

7. The filter circuit according to claim 1, wherein each of the plurality of resistors comprises one of different resistances than each other of the resistors.

8. The filter circuit according to claim 7, wherein ones of different voltages are applied to ones of the filter units, wherein each resistor of each filter unit to which ones of higher voltages of the different voltages are applied comprises a respective one of higher resistances of the different resistances than each resistor of each filter unit to which ones of lower voltages of the different voltages are applied, and wherein the higher voltages are higher in voltage than the lower voltages.

\* \* \* \* \*